AMPLIFIER WITH TWO CHANNELS FOR TWO-WAY SPEECH CONNECTION

Filed March 16, 1964 2 Sheets-Sheet 1

Inventor:
Karl Ivar Lennart Skoog
By: Wenderoth, Lind and Ponack
Attorneys

Inventor: Karl Ivan Lennart Skoog
By: Wenderoth, Lind and Ponack
Attorneys

United States Patent Office 3,324,256
Patented June 6, 1967

3,324,256

AMPLIFIER WITH TWO CHANNELS FOR TWO-WAY SPEECH CONNECTION

Karl Ivan Lennart Skoog, Farsta, Sweden, assignor to Aktiebolaget Gylling & Co., Stockholm-Grondal, Sweden Filed Mar. 16, 1964, Ser. No. 352,202
Claims priority, application Sweden, Mar. 19, 1963, 2,954/63
8 Claims. (Cl. 179—170)

ABSTRACT OF THE DISCLOSURE

A two-way amplifier having voice operated switching means, each switching means comprising a transistor serving as an attenuator. The transistors of the two channels having their base electrodes connected to a control voltage generator for supplying control voltages of different polarities to said base electrodes. Said transistors having further emitter impedances, at least a part of said emitter impedances being common for the two transistors in order to increase the control range and obtain a smooth control of the switching operation.

The present invention relates to an amplifier with two channels for two way speech connection to be used in intercommunication systems of the push button operated type or so called loud speaking telephones.

Usually, in systems of this type each amplifier channel has a moderate rest amplification. In dependence of signal voltages (speech voltages) fed to the channels control voltages are generated in a control voltage generator, which control voltages control variable attenuator sets and/or amplifiers in the channels in such a manner that the amplification in one channel is increased and the amplification in the other channel is simultaneously decreased, preferably with essentially one and the same value.

Various types of such amplifiers have been proposed, and besides the design of the attenuator sets a great deal of interest has also been placed on the principles for taking out control voltages.

Fundamental for the design of such devices is an amplifier and a variable attenuator, or a variable amplifier with a moderate but well defined rest amplification, and means for altering the amplification, either to a higher well defined value or to a lower well defined value. However, the means as hitherto proposed, especially of the type where the attenuation is brought about by controlling diodes in the channel circuits, suffer from certain considerable drawbacks. Thus, diodes are very temperature dependent, and the control range, with respect to the control voltage input, between the extreme conditions when the diode is in blocked condition and when it is in conducting condition, is comparatively small as expressed in volts, viz some tenths of one volt. The derived signal component is normally taken out in voltage form, i.e. the control voltage source has normally a comparatively low internal resistance, but in view of the narrow control range and due to its own varying and sometimes very low impedance a diode is unsuitable as attenuator, if it is voltage controlled. Therefore, the diode should preferably be current controlled, i.e. the control source should have a comparatively high internal resistance.

One system has been proposed, in which the diodes in the both channels are controlled by the current from a pair of transistors with a common emitter resistor (so called long tailed pair), which system has some advantages. However, there still resist the drawbacks that a long tailed pair in the proposed arrangement has a very narrow control range, viz. about a tenth of a volt, and, furthermore, there still remain the other drawbacks of the diode control, such as the difficulty of determining the rest attenuation.

The present invention remedies the drawbacks which are inherent with the use of diode control. Furthermore, with a modified arrangement according to the invention it is possible to obtain any desired control range. According to a further embodiment of the invention it is ensured that the rest amplification may be set at any desired value.

The invention relates to amplifiers with two channels for two way speech connection, in which variable attenuators are arranged in such a manner that control voltages, generated in dependence of signal voltages passing the attenuators, are fed to control means in the attenuators in such a manner that when the attenuation in one of the channels of the amplifier is increased the attenuation in the other channel is automatically decreased.

The invention is essentially characterized in that there is provided means comprising two transistors, to which means the control voltage is fed, said transistors having emitter resistances which are at least partially common to both transistors, and in that the system is arranged in such a manner that when the current through one of the transistors increases the current through the other transistor decreases, as well in that the output impedances of each one of the transistors each constitute variable impedances in an attenuator.

The present invention will now be described in greater detail with reference to the accompanying drawings, in which.

Figure 1:
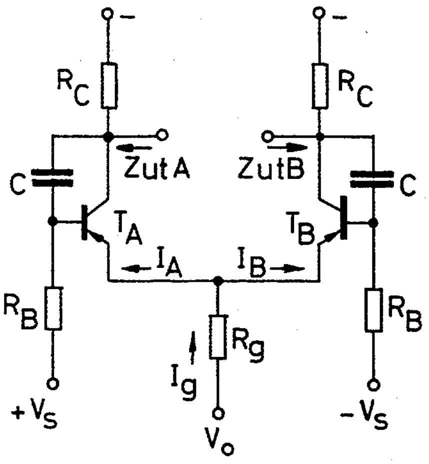
FIGURE 1 is a circuit diagram of a system in which there is obtained a variation of impedances, used in attenuators in two channel amplifiers.

In FIGURE 1 there are shown two transistors $T_A$, $T_B$, the emitter electrodes of which are connected to a common emitter resistor $R_g$, which in turn is connected to a positive voltage $V_o$. Each one of the transistors has been arranged with a collector electrode resistor $R_C$ and a base electrode resistor $R_B$, which have been given identical reference signs for both of the transistor circuits so as to stress the symmetrical arrangement of the system. If the supplied base control voltage $V_S$ is zero, then the base electrodes obtain the same voltage so that—provided that the transistors are entirely identical—the current $I_g$ flowing through the common emitter resistor $R_g$ is shared in similar parts $I_A$ and $I_B$ between the two transistors. If now control voltages $V_S$ are supplied, which depart from the value zero, and assuming that said control voltages have different polarities $-V_S$ and $+V_S$, respectively, on the both transistors, then the current distribution between the two transistors is changed, and one of the transistors may take the whole current already at a value of about 50 mv. for $V_S$ whereas the current through the other transistor drops to zero. It has been proposed to let the currents $I_A$ and $I_B$, respectively, through the transistors to pass also through diodes, utilized in attenuators, so as to enable a variation of the attenuation. However, in this connection diodes are less suitable in view of the fact that when the impedance thereof is varied also the current therethrough is varied. The control of the diode currents becomes comparatively bad inasmuch as the current besides passing to the diodes is also distributed to other parallel resistors in the circuits, in FIGURE 1 represented by the collector resistors $R_C$.

Instead, according to the invention, use is made of the output impedances $Z_{ut}$ A and $Z_{ut}$ B of the transistors $T_A$ and $T_B$, respectively, the values of which are dependent of the emitter currents $I_A$ and $I_B$, respectively, passing through the transistors. Normally, the output impedances of the transistors exhibit a very high value, but by arranging for a strong degenerative coupling by means of capacitors C, disposed between the collector and base electrodes, there is obtained a considerable reduction of the output impedances. In case the capacitors are connected without series resistors there is obtained an output impedance the value of which is nearly 25/Ie ohms, where Ie is the emitter current in mamps. Thus, at an emitter current $I_A$ or $I_B$, respectively, of 1 mamp. the output impedance $Z_{ut}$ amounts to about 25 ohms. Therefore, in dependence of the value and polarity of the control voltage $V_S$ the emitter currents and therewith the output impedances are changed in such a manner that when the output impedance of one transistor is decreased then the output impedance of the other transistor is increased. The maximum impedance value will be determined by the other components, such as collector resistor and base electrode resistor or by a specially arranged parallel impedance (not shown).

The system as set forth in FIGURE 1 suffers from two essential drawbacks. One drawback is that the rest currents are very dependent on the symmetry of the circuits (in the first instance that of the transistors), and the other one is that the control range is comparatively narrow (about 50 mvolts).

Figure 2:
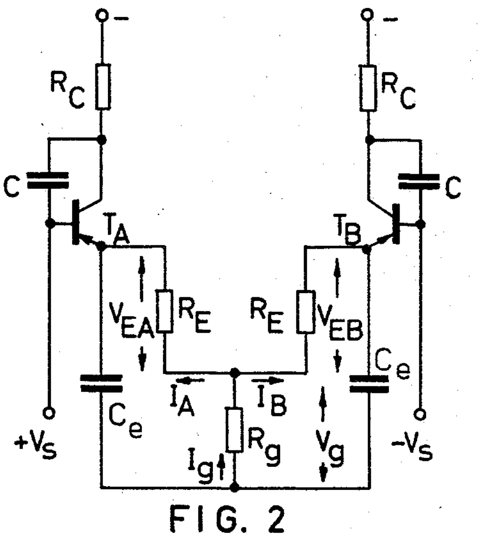
FIGURE 2 shows a further developed embodiment of the invention, in which it is possible to set at will the variation range of control voltages acting on the attenuator set.

In the system in FIGURE 2 there are provided, besides the common emitter resistor, individual emitter resistors $R_E$, which essentially provide for a negative current feed-back with respect to the D.C. value of the emitter currents. Possible deficiencies in symmetry are automatically balanced out to a considerable degree by the voltage drop $V_{EA}$ and $V_{EB}$, respectively, which is caused by the direct current $I_A$ and $I_B$ through the individual emitter resistors. Furthermore, a considerably higher control voltage $V_S$ will be required to link over the whole current to one transistor. Thus, a control voltage range of 1 volt, for instance, may easily be obtained. With a system as shown in FIGURE 1 the value of the emitter current as a function of the control voltage is very non-linear. By introducing individual emitter resistors $R_E$ as in FIGURE 2 there is obtained, if $R_g > R_E$, a very good linearity between the value of the control voltage $V_S$ and the emitter currents of the two transistors, which is of utmost importance when the system is used in a double channel amplifier. The current $I_g$ through the common emitter resistor $R_g$ is in rest condition shared in essentially similar portions between the two transistors so that the emitter current for each transistor is $I_g/2$. Thus, the output impedances in rest condition become mainly according to the above mentioned formula $$Z_{ut} = \frac{25}{I_g/2}$$

ohms. By supplying control voltages $V_S$ of different polarities to the both transistors $T_A$ and $T_B$ the emitter current of one transistor $T_A$ may obviously be varied essentially between the value 0 and the value $I_g$. In this case the highest value of the output impedance of the transistors $T_A$ (when $I_A \rightarrow 0$) is determined by the other component parts such as the collector resistor $R_C$. Thus, the impedance variation from rest condition to the highest value may be made great. The impedance variation between the rest condition and the lowermost impedance value ($I_A = I_g$) is limited between the value $$\frac{25}{I_g/2}$$

in rest condition and the value $25/I_g$ in the condition of the lowermost impedance. Thus, the maximum variation in the last mentioned direction is 2 times or 6 db, which is too little in many instances.

Figure 3:
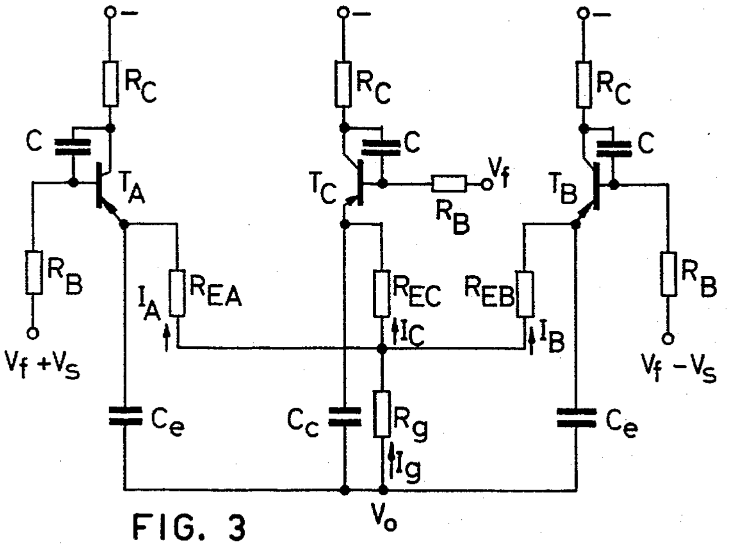
FIGURE 3 shows another embodiment of the invention, in which the rest attenuation as well as the highest and lowest attenuation, respectively, may be set at will.

By the modification of the invention which is set forth in FIGURE 3 the impedance variation may be chosen freely, and the variation from rest condition to the lowermost impedance condition may be made considerably greater than 6 db. This is obtained by connecting the emitter of a third transistor $T_C$, preferably through an individual emitter resistor $R_{EC}$, to the common emitter resistor $R_g$, in which case the other circuits of the third transistor may be designed in the same way as the corresponding circuits of the transistors $T_A$ and $T_B$, if desired. In rest condition the base electrodes of all three transistors are assumed to be on the same potential, viz. the base bias voltage $V_f$. Then, in rest condition the common emitter current $I_g$ is divided up in inverse proportion to the value of the individual emitter resistors $R_{EA}$, $R_{EB}$, $R_{EC}$. Obviously, the values of the rest emitter currents of the transistors $T_A$ and $T_B$ is dependent on the value of the emitter resistor $R_{EC}$, and provided that this resistor is of the variable type, the emitter currents may be varied in such a manner that instead of the emitter current being $I_g/2$ in FIGURE 2 according to FIGURE 3 a value of $I_g/10$, for instance, may be obtained, in which case the third transistor receives the current $8I_g/10$ whereas the both transistors $T_A$ and $T_B$ receive the current $2I_g/10$ together.

Thus, in this assumed case the output impedance of each one of the transistors $T_A$ and $T_B$, respectively, will be $$\frac{25}{I_g/10}$$

and when the emitter current of one of the transistors has its greatst value, i.e. the value $I_g$, the lowermost impedance will be $25/I_g$, in which case an impedance reduction of ten times has been obtained, corresponding to 20 db. By supplying control voltage it is obviously suitable to let the third transistor retain its base bias voltage $V_f$, whereas the base bias voltages of the other two transistors are varied, one in positive sense and the other in negative sense with respect to $V_f$, to enable a variation of the current distribution and therewith also the output impedances between sufficiently spaced limit values.

Figure 4:
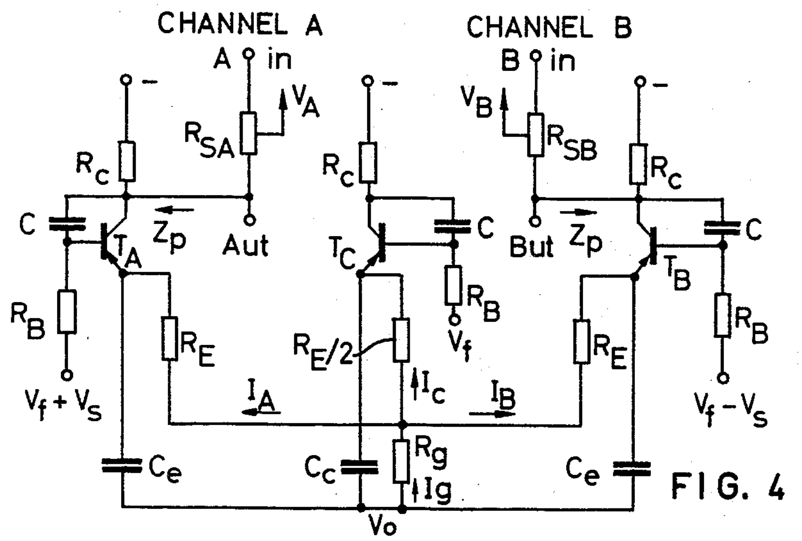
FIGURE 4 illustrates a practical embodiment of the invention, wherein the variable impedances are used as parallel impedances in an attenuator set consisting of series and parallel impedances.

FIGURE 4 shows a practical embodiment of the system in FIGURE 3, suitable for use in a loud speaking telephone, for instance. The figure shows only those parts of the system, that are essential for the present invention. Other components, such as microphone, loud speaker, means for generating control voltages etc., are well known and therefore not shown. The output impedances of the both control transistors $T_A$ and $T_B$ are linked in as impedances $Z_p$ in attenuators in each one of the channels (A and B, respectively, FIGURE 4). The system is so arranged that a signal voltage supplied to the input of the channel A, for instance, is attenuated in dependence of the values of, firstly, a series impedance $R_{SA}$, and, secondly, that parallel impedance $Z_p$ which is essentially represented by the output impedance of the transistor $T_A$. Naturally, it is possible to connect a plurality of attenuators according to the invention one after the other, with intermediate amplifiers, if desired. Control voltage generating signal voltage $V_A$, $V_B$ may be tapped from taps on the series resistors $R_{SA}$, $R_{SB}$. If such taps are arranged to be set on any desired point between the attenuator input $A_{in}$ and the output $A_{out}$ thereof it is possible to predetermine the influence of the variation of the attenuator $Z_p$ on the transmission of the signal voltage through the channel and the transmission of the signal voltage to the control voltage generating means (not shown).

The emitter resistors of the transistors determine the rest attenuation in the both channels. In the system in FIGURE 4 these emitter resistors have been assumed to have the value $R_E$ for the transistors $T_A$ and $T_B$, and $R_E/2$ for the transistor $T_C$. Then, in rest condition the following current distribution between the three transistors will exist:

$$I_A=I_B=I_C/2$$

Figure 5:
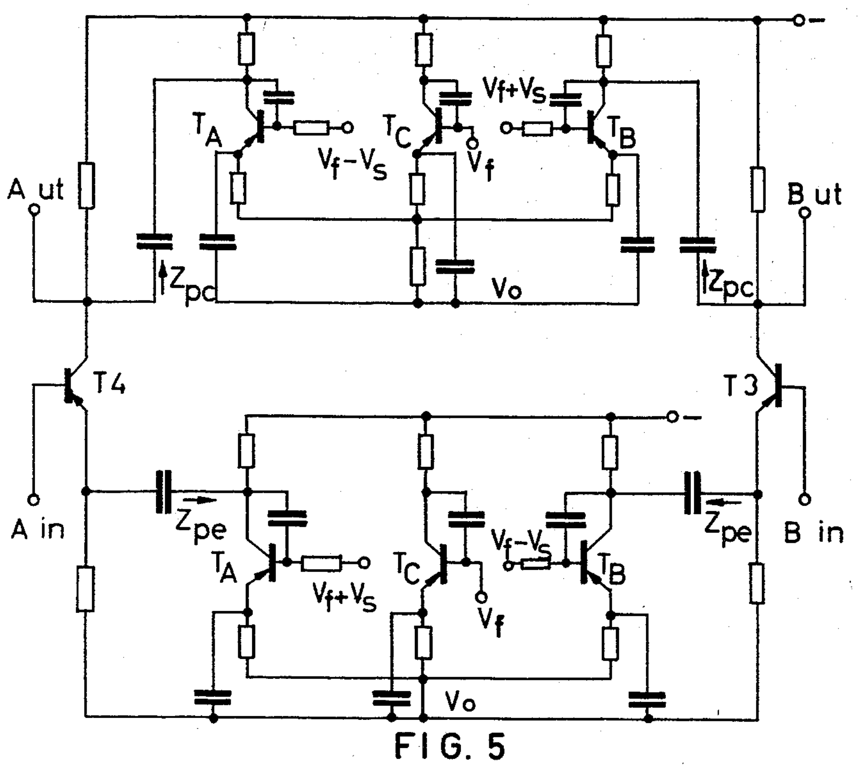
FIGURE 5 illustrates a portion of a variable two way amplifier, in which the variable impedances according to the invention are being used as emitter and collector resistances to the transistors in the respective channels.

Finally, FIGURE 5 illustrates a very suitable embodiment of attenuators in a double channelled amplifier in a telephone system, where attenuators according to the invention, similar to that as disclosed with reference to FIGURE 4 and representing the impedance values designated $Z_{pe}$ and $Z_{pc}$, have been linked in, firstly, as emitter resistor $Z_{pe}$, and, secondly, as collector resistor $Z_{pc}$ of two transistors, arranged in normal way as amplifier stages in each one of the channels of the amplifier. When the output impedances of the control transistors $T_A$, $T_B$ are varied in the above mentioned way, naturally also the amplification of the transistors T4 and T5 will vary. Due to the symmetrical design of the entire system the upward control, i.e. the increase of amplification in one channel, and the downward control, i.e. the decrease of amplification in the other channel, will correspond exactly to each other, for which reason a very good stability will be obtained. It is also important that the current consumption is nearly independent of the control, which is essential, in particular by loud speaking telephones.

What I claim is:

1. An amplifier with two channels for two-way speech communication having an attenuator in each channel, each attenuator comprising one transistor connected as a parallel impedance between a point of said channel and a point of constant voltage, said transistors of the two channels of the amplifier having their emitters connected through a common resistor to said point of constant voltage, each channel of said amplifier having a point for taking out signal voltage and means for supplying such signal voltage to a control voltage generator belonging to said channel, said generator supplying two control voltages of different polarities, means for supplying one of said control voltages to the base electrode of the one of said transistors which belongs to the channel that is passed by signals so as to increase its impedance and increase the gain of said channel, and means for supplying the other of said control voltages to the other transistor belonging to the other channel, so as to decrease its impedance and decrease the gain in said other channel.

2. An amplifier as claimed in claim 1 wherein each of said transistors has a negative feed-back path for signal voltages, said feed-back path comprising an impedance connected between the collector electrode and the base electrode of such transistor.

3. An amplifier according to claim 1 wherein each of said transistors has an individual emitter resistor connected between the emitter electrode of the transistor and one end of the common emitter resistor.

4. An amplifier according to claim 3 wherein there is one further transistor, said further transistor having its emitter electrode connected to the end of the common emitter impedance where the individual emitter impedances are connected, said further transistor having its collector electrode connected to a source of constant voltage through a collector resistor and its base electrode connected to a source of constant bias voltage through a base resistor.

5. An amplifier according to claim 3 in which said individual emitter impedances have different values so as to obtain a greater change of amplification in one channel when said channel is passed by signals than in the other channel when said other channel is passed by signals.

6. An amplifier according to claim 1 wherein the emitter electrodes of said transistors are connected to said point with fixed voltage through capacitors of sufficient capacity to eliminate the A.C.-feedback from said emitter impedances but maintain the D.C.-feedback.

7. An amplifier with two channels for two-way speech communication having an attenuator in each channel, each attenuator comprising one transistor connected as a parallel impedance between a point of said channel and a point of constant voltage, said transistors of the two channels of the amplifier having their emitters connected through a common resistor to said point of constant voltage, each channel of said amplifier having a point for taking out signal voltage and means to supply such signal voltage to a control voltage generator belonging to said channel, said generator supplying two control voltages of different polarities, means for supplying one of said control voltages to the base electrode of the one of said transistors which belongs to the channel that is passed by signals so as to increase its impedance and increase the gain of said channel, and means for supplying the other of said control voltages to the other transistor belonging to the other channel, so as to decrease its impedance and decrease the gain in said other channel, the point of each channel where the attenuator transistor is connected to the channel being preceded by an impedance, the point of each channel where said signal voltage is taken out and supplied to the control voltage generator being located on a point of said impedance.

8. An amplifier with two channels for two-way speech communication having an attenuator in each channel, each attenuator comprising one transistor connected as a parallel impedance between a point of said channel and a point of constant voltage, said transistors of the two channels of the amplifier having their emitters connected through a common resistor to said point of constant voltage, each channel of said amplifier having a point for taking out signal voltage and means for supplying such signal voltage to a control voltage generator belonging to said channel, said generator supplying two control voltages of different polarities, means for supplying one of said control voltages to the base electrode of the one of said transistors which belongs to the channel that is passed by signals so as to increase its impedance and increase the gain of said channel, and means for supplying the other of said control voltages to the other transistor belonging to the other channel, so as to decrease its impedance and decrease the gain in said other channel, said point of each channel where the attenuator transistor is connected to the channel being preceded by a transistor acting as an amplifier stage, said transistor having an emitter impedance in the form of the collector-emitter path of a transistor, the base electrode of said transistor being connected to the control voltage generator so that the impedance of said transistor is decreased when the channel to which the transistor belongs is passed by signals.

References Cited

UNITED STATES PATENTS

| | | | |
|---|---|---|---|
| 2,392,496 | 1/1946 | Norwine | 179—170.8 |
| 2,933,693 | 4/1960 | Battersby et al. | 330—138 |

KATHLEEN H. CLAFFY, *Primary Examiner.*

H. ZELLER, *Assistant Examiner.*